(12) United States Patent
Ghrayeb et al.

(10) Patent No.: US 11,733,688 B2
(45) Date of Patent: Aug. 22, 2023

(54) SYSTEM AND METHOD FOR RECOGNIZING AND FORECASTING ANOMALOUS SENSORY BEHAVIORAL PATTERNS OF A MACHINE

(71) Applicant: SKF AI, Ltd., Yoqneam (IL)

(72) Inventors: Waseem Ghrayeb, Nazareth Illit (IL); David Lavid Ben Lulu, Nesher (IL)

(73) Assignee: AKTIEBOLAGET SKF, Gothenburg (SE)

( * ) Notice: Subject to any disclaimer, the term of this patent is extended or adjusted under 35 U.S.C. 154(b) by 210 days.

(21) Appl. No.: 17/236,413

(22) Filed: Apr. 21, 2021

(65) Prior Publication Data
US 2021/0240178 A1 Aug. 5, 2021

Related U.S. Application Data

(63) Continuation of application No. PCT/US2019/059627, filed on Nov. 4, 2019.

(60) Provisional application No. 62/754,591, filed on Nov. 2, 2018.

(51) Int. Cl.
*G05B 23/02* (2006.01)
*H04L 67/12* (2022.01)

(52) U.S. Cl.
CPC ..... *G05B 23/0232* (2013.01); *G05B 23/0235* (2013.01); *G05B 23/0283* (2013.01); *H04L 67/12* (2013.01)

(58) Field of Classification Search
CPC .... G06N 20/00; H04L 67/12; G05B 23/0232; G05B 23/0235; G05B 23/024; G05B 23/0283; G06F 30/27

USPC ........................................................ 702/183
See application file for complete search history.

(56) References Cited

U.S. PATENT DOCUMENTS

| 9,600,394 B2 * | 3/2017 | Salunke .............. G06F 11/3608 |
| 2002/0091972 A1 | 7/2002 | Harris et al. |
| 2013/0060524 A1 | 3/2013 | Liao |
| 2015/0313529 A1 | 11/2015 | Nevo et al. |

FOREIGN PATENT DOCUMENTS

WO 2020093036 A1 5/2020

OTHER PUBLICATIONS

International Search Report and Written Opinion of International Searching Authority for PCT/US2019/059627, ISA/RU, Moscow, Russia, dated Feb. 12, 2020.

* cited by examiner

*Primary Examiner* — John H Le
(74) *Attorney, Agent, or Firm* — M&B IP Analysts, LLC

(57) ABSTRACT

A system and method for recognizing and forecasting anomalous sensory behavioral patterns of a machine, including: monitoring a first set of time-stamped sensory input data related to at least one machine; determining, upon analysis of the first set of time-stamped sensory input data, a first suspicious pattern of a first anomalous sensory input behavior associated with the first set of time-stamped sensory input data; comparing the first suspicious pattern to a second pattern of a second anomalous sensory input behavior that is associated with a second set of time-stamped sensory input data, wherein the second pattern previously determined to be indicative of a machine failure; and, determining if the first suspicious pattern is correlated above a predetermined threshold with the second pattern.

17 Claims, 4 Drawing Sheets

SYSTEM AND METHOD FOR RECOGNIZING AND FORECASTING ANOMALOUS SENSORY BEHAVIORAL PATTERNS OF A MACHINE

CROSS-REFERENCE TO RELATED APPLICATIONS

This application is a continuation of PCT Application No. PCT/US2019/059627 filed on Nov. 4, 2019, which claims the benefit of U.S. Provisional Application No. 62/754,591 filed on Nov. 2, 2018. The contents of the above-referenced applications are hereby incorporated by reference.

TECHNICAL FIELD

The present disclosure relates generally to maintenance systems for machines, and, more specifically, to recognizing and forecasting anomalous sensory behavioral patterns of such machines.

BACKGROUND

Communications, processing, cloud computing, artificial intelligence, and other computerized technologies have advanced significantly in recent years, heralding in new fields of technology and production. Notwithstanding these improvements, many of the industrial technologies employed since or before the 1970s remain in use today. Existing solutions related to these industrial technologies have typically seen minor improvements, thereby increasing production and yield only slightly.

In modern manufacturing practices, manufacturers must often meet strict production timelines and provide flawless or nearly flawless production quality. As a result, these manufacturers risk heavy losses whenever an unexpected machine failure occurs. A machine failure is an event that occurs when a machine deviates from correct service. Errors, which are typically deviations from the correct state of the machine, are not necessarily failures, but may lead to and indicate potential future failures. Aside from failures, errors may otherwise cause unusual machine behavior that may affect performance.

The average failure-based machine downtime for typical manufacturers (i.e., the average amount of time in which production shuts down, either in part or in whole, due to machine failure) is 17 days per year, i.e., 17 days of lost production and, hence revenue. In the case of a typical 450-megawatt power turbine, for example, a single day of downtime can cost a manufacturer over $3 million US in lost revenue. Such downtime may incur additional costs related to repair, safety precautions, and the like.

In energy power plants, billions of US dollars are spent annually on ensuring reliability. Specifically, billions of dollars are spent on backup systems and redundancies to minimize production downtimes. Additionally, monitoring systems may be used to identify failures quickly, thereby speeding up return to production when downtime occurs. However, existing monitoring systems typically identify failures only after, during, or immediately before downtime begins.

Further, existing solutions for monitoring machine failures typically rely on a set of predetermined rules for each machine. These rule sets do not account for all data that may be collected with respect to the machine and may only be used for checking particular key parameters while ignoring the rest. Moreover, these rule sets must be provided in advance by engineers or other human analysts. As a result, only some of the collected data may be actually used by existing solutions, thereby resulting in wasted use of computing resources related to transmission, storage, and processing of unused data. Further, failure to consider all relevant data may result in missed or otherwise inaccurate determination of failures.

Additionally, existing solutions often rely on periodic testing at predetermined intervals. Thus, even existing solutions that can predict failures in advance typically return requests to perform machine maintenance even when the machine is not in immediate danger of failing. Such premature replacement results in wasted materials and expenses spent replacing parts that are still functioning properly. Further, such existing solutions often determine failures only after failure occurs. As a result, such failures may not be prevented, resulting in downtime and lost revenue.

Lastly, existing monitoring and maintenance solutions often require dedicated testing equipment. Consequently, these solutions typically require specialized operators who are well-trained in the operation of each monitoring and maintenance system. Requiring specialized operators can be inconvenient and costly and may also introduce potential sources of human error. Given the sheer amount of data that may be collected for any given machine, in addition to minute fluctuations in data, a human analyst is often not capable of adequately determining upcoming failures.

It would therefore be advantageous to provide a solution that would overcome the challenges noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "certain embodiments" may be used herein to refer to a single embodiment or multiple embodiments of the disclosure.

Certain embodiments disclosed herein include a method for recognizing and forecasting anomalous sensory behavioral patterns of a machine, including: monitoring a first set of time-stamped sensory input data related to at least one machine; determining, upon analysis of the first set of time-stamped sensory input data, a first suspicious pattern of a first anomalous sensory input behavior associated with the first set of time-stamped sensory input data; comparing the first suspicious pattern to a second pattern of a second anomalous sensory input behavior that is associated with a second set of time-stamped sensory input data, wherein the second pattern previously determined to be indicative of a machine failure; and, determining if the first suspicious pattern is correlated above a predetermined threshold with the second pattern.

Certain embodiments disclosed herein also include a non-transitory computer readable medium having stored thereon instructions for causing a processing circuitry to perform a process, the process including: monitoring a first set of time-stamped sensory input data related to at least one machine; determining, upon analysis of the first set of time-stamped sensory input data, a first suspicious pattern of a first anomalous sensory input behavior associated with the first set of time-stamped sensory input data; comparing the first suspicious pattern to a second pattern of a second anomalous sensory input behavior that is associated with a second set of time-stamped sensory input data, wherein the second pattern previously determined to be indicative of a machine failure; and, determining if the first suspicious pattern is correlated above a predetermined threshold with the second pattern.

Certain embodiments disclosed herein also include a system for recognizing and forecasting anomalous sensory behavioral patterns of a machine, including: a processing circuitry; and a memory, the memory containing instructions that, when executed by the processing circuitry, configure the system to: monitor a first set of time-stamped sensory input data related to at least one machine; determine, upon analysis of the first set of time-stamped sensory input data, a first suspicious pattern of a first anomalous sensory input behavior associated with the first set of time-stamped sensory input data; compare the first suspicious pattern to a second pattern of a second anomalous sensory input behavior that is associated with a second set of time-stamped sensory input data, wherein the second pattern previously determined to be indicative of a machine failure; and, determine if the first suspicious pattern is correlated above a predetermined threshold with the second pattern.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
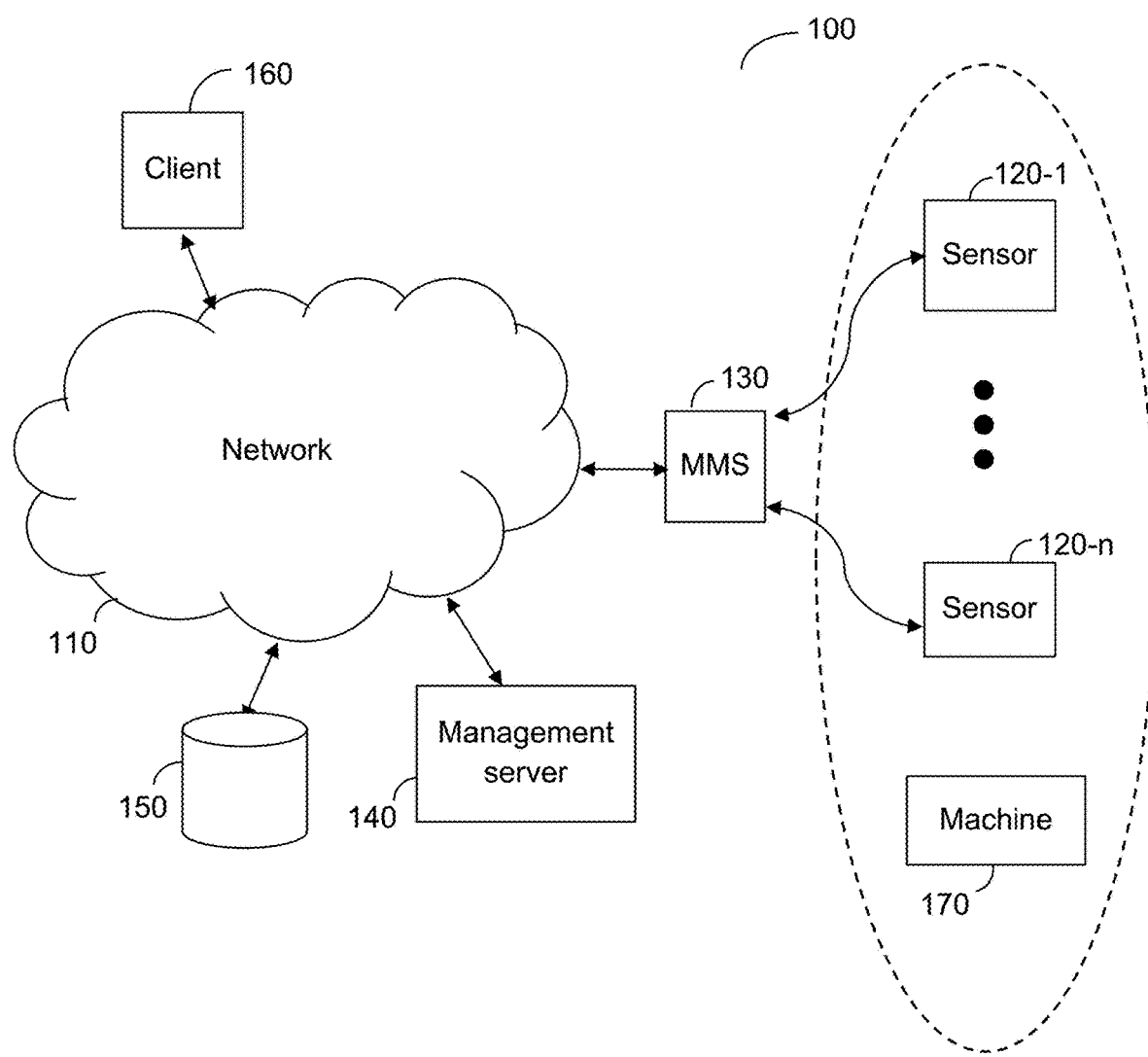
FIG. 1 is a network diagram utilized to describe the various disclosed embodiments.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

The various disclosed embodiments include a method for recognizing and forecasting anomalous sensory behavior patterns of a machine. By monitoring and analyzing sensory inputs of a machine, a first suspicious pattern of a first anomalous sensory input behavior is determined. The first pattern is then compared to at least a second pattern that is indicative of a second anomalous sensory input behavior associated with sensory inputs that were previously analyzed and determined to be indicative of a machine failure. Upon determination that the first suspicious pattern is correlated above a predetermined threshold with the at least a second pattern, a notification that indicates an upcoming machine failure is generated. The notification may include several insights and may be indicative of, for example, a root cause of the recognized pattern and/or for upcoming machine failure.

FIG. 1 is an example network diagram 100 utilized to describe the various disclosed embodiments. The example network diagram 100 includes a machine monitoring system (MMS) 130, a management server 140, a database 150, and a client device 160 connected through a network 110. The example network diagram 100 further includes a plurality of sensors 120-1 through 120-n (hereinafter referred to individually as a sensor 120 and collectively as sensors 120, merely for simplicity purposes, where n is an integer equal to or greater than 1), connected to the machine monitoring system 130. The network 110 may be, but is not limited to, a wireless, a cellular or wired network, a local area network (LAN), a wide area network (WAN), a metro area network (MAN), the Internet, the worldwide web (WWW), similar networks, and any combination thereof.

The client device 160 may be, but is not limited to, a personal computer, a laptop, a tablet computer, a smartphone, a wearable management server, or any other device capable of receiving and displaying notifications indicating maintenance and failure timing predictions, results of supervised analysis, unsupervised analysis of machine operation data, or both.

The sensors 120 are located in proximity (e.g., physical proximity) to a machine 170. The machine 170 may be any machine for which performance can be represented via sensory data such as, but not limited to, a turbine, an engine, a welding machine, a three-dimensional (3D) printer, an injection molding machine, a combination thereof, a portion thereof, and the like. Each sensor 120 is configured to collect sensory input data such as, but not limited to, sound signals, ultrasound signals, light, movement tracking indicators, temperature, energy consumption indicators, and the like based on operation of the machine 170. The sensors 120 may include, but are not limited to, sound capturing sensors, motion tracking sensors, energy consumption meters, temperature meters, and the like. Any of the sensors 120 may be connected, communicatively or otherwise, to the machine 170 (such connection is not illustrated in FIG. 1 merely for the sake of simplicity and without limitation on the disclosed embodiments).

The sensors 120 are connected to the machine monitoring system 130. In an embodiment, the machine monitoring system 130 is configured to store and preprocess raw sensory input data received from the sensors 120. Alternatively, or collectively, the machine monitoring system 130 may be configured to periodically retrieve collected sensory input data stored in, for example, the database 150. The preprocessing may include, but is not limited to, data cleansing, normalization, rescaling, re-trending, reformatting, noise filtering, a combination thereof, and the like.

In an embodiment, the management server 140 is configured to monitor at least a first set of time-stamped sensory input data, hereinafter sensory inputs, that is related to at least one machine, e.g., the machine 170. The management server 140 is configured to receive via the network 110 the sensory inputs associated with the at least one machine. The sensory inputs may be received constantly and may be received in real-time or near real-time. The sensory inputs may be received from the sensors 120. According to an embodiment, the sensory input data is received using the MMS 130 over the network 110 by the management server 140.

The first set of sensory inputs may include several types of sensory inputs, where each type of the sensory inputs may be related to at least a process that is associated with the machine, executed by the machine, and the like. That is, for example, a first type of sensory input data may be related to the temperature of the machine 170, a second type of sensory input data may be related to the speed of a certain gear of the machine 170, and so on. In a further embodiment, the management server 140 is configured to receive preprocessed sensory input data.

In an embodiment, the management server 140 may further store the sensory input (raw, preprocessed, or both) received from the machine monitoring system 130. Alternatively, or collectively, the sensory input may be stored in the database 150. The database 150 may further store sensory input data (raw, preprocessed, or both) collected from a plurality of other sensors (not shown) associated with other machines (also not shown). The database 150 may further store anomalous patterns, behavioral trends, failure predictions, machine learning models utilized for analyzing sensory input data, or a combination thereof.

In an embodiment, the management server 140 is configured to analyze the first set of time-stamped sensory input data. The analysis may be achieved using one or more machine learning models, such as, but not limited to, deep learning, designed to detect anomalies in each type of the sensory input data. In a further embodiment, the analysis may be achieved by comparing the first set of sensory inputs to previous sensory data that is stored in a database, e.g., the database 150, indicating on regular parameters of a plurality of types of sensory input data that were previously determined to reflect regular operation of at least a component of a machine, e.g., the machine 170.

In an embodiment, the management server 140 determines, upon analysis of the first set of time-stamped sensory input data, a first suspicious pattern of a first anomalous sensory input behavior that is associated with the first set of time-stamped sensory input data. The first suspicious pattern of the first anomalous sensory input behavior may include, for example, sensor measurement features, sensor anomalies, anomalous groups, machinery operational states, machine faults, and the like.

The first suspicious pattern may include one or more arrays of sensor anomalies, anomalous groups, and the like, that reflect the time at which each anomaly occurred and other related information, such as values associated with the anomalies, i.e., abnormal parameters values, features, and the like. The abnormal parameters values may be, for example, the temperature of the machine or a portion thereof, pounds per square inch (PSI), speed, etc. associated with a machine, e.g., the machine 170.

As a non-limiting example, the first suspicious pattern may include ten anomalies that are associated with three different types of sensory inputs being monitored by the management server 140. According to the same example, the first type relates to the revolutions per minute (RPM) of the machine and the anomalies associated therewith, occurring first, the second type relates to sensors for vibration and the anomalies associated therewith, occurring second, and the third type relates to machine temperature and the anomalies associated therewith, occurring third. In an embodiment, the first suspicious pattern may be determined by, for example, applying a correlation function that collects one or more characteristics of the sensory inputs and applies one or more correlation rules to the collected characteristics.

In an embodiment, the management server 140 compares the first suspicious pattern of the first anomalous sensory input behavior to at least a second pattern of a second anomalous sensory input behavior that is associated with at least a second set of time-stamped sensory input data. The second pattern of the second anomalous sensory input behavior may include, for example, sensor measurement features, sensor anomalies, anomalous groups, machinery operational states, machine faults, and the like. The second pattern is indicative of a machine failure that previously occurred. The second pattern is previously generated and may be stored in a database, e.g., the database 150, upon analysis of the second set of sensory inputs. The second set of sensory inputs that was previously analyzed may be related to the same at least one machine, to other machines, or a combination thereof. The abovementioned comparison may be achieved by applying at least one machine learning algorithm on the at least one first suspicious pattern and the at least a second pattern.

In an embodiment, the management server 140 generates a notification that forecasts an upcoming machine failure of the at least one machine upon determination that the first suspicious pattern is correlated above a predetermined threshold with the at least one second pattern. In an embodiment, the notification may include a specific time left until downtime, corrective solution recommendations, root cause details, and the like.

The predetermined threshold may be crossed when, for example, the first suspicious pattern includes three types of anomalies and a second pattern also includes at least the same three types of anomalies. In an embodiment, the time period at which the first suspicious pattern and the second pattern occurred may also be considered when determining if the first suspicious pattern and the second pattern are correlated above a predetermined threshold.

It should be noted that the first suspicious pattern may be determined to be correlated above the predetermined threshold even when only part of the second pattern is correlated with the first suspicious pattern, or part of it. For example, the second pattern that was previously determined to indicate a machine failure may include five anomalies that developed into a machine failure, having particular characteristics, and arranged in a certain order. According to the same example, although the first suspicious pattern includes only three anomalies, at a certain point in time, a correlation above a predetermined threshold between the first suspicious pattern and the second pattern may still be determined. According to the same example, the determination may be achieved upon identification of similarity above a predetermined threshold between the characteristics of the anomalies of the first suspicious pattern and the characteristics of the first three anomalies of the second pattern as well as the certain order at which the anomalies are arranged.

In an embodiment, the management server 140 is configured to generate a forecasting model indicating the probability that a machine failure is about to happen. The forecasting model may be generated based on the determination that the first suspicious pattern is correlated above a predetermined threshold with the at least a second pattern.

In an embodiment, upon determination that the first suspicious pattern and at least a second pattern are correlated above a predetermined threshold, the first suspicious pattern may be classified as a sequence that will cause a machine failure even when the first pattern, i.e., the sequence, includes, at the time of the monitoring, only part of the anomalies that previously determined to cause a machine failure by the second pattern. As a non-limiting example, a second pattern that was determined to be correlated above a predetermined threshold to a first suspicious pattern includes ten anomalies arranged in a certain time series that caused a previous machine failure. According to the same example, the first suspicious pattern that is currently monitored may include only two of the ten anomalies however, the management server 140 may still be configured to forecast the sequence of the first suspicious pattern, or specifically predict, in a certain level, an upcoming machine failure. The forecasting may be determined based on the time at which these two anomalies of the first suspicious pattern were identified with respect to the first two anomalies of the second pattern, the values of the anomalies of the first suspicious pattern with respect to the values of the first two anomalies of the second pattern, and the like.

According to another embodiment, a pattern may include a series of patterns, or sub-patterns. For example, an abnormal behavior of the sensory inputs, such as a sequence of anomalies, groups of anomalies, and the like, may be identified on Sunday and classified as pattern "A". According to the same example, a second and unrelated abnormal behavior of the sensory inputs may be identified on Monday and may be classified as pattern "B". It should be noted that the pattern "A" and pattern "B" may refer to different sensors and different parameters of the machine. According to the same example, a new pattern "C", that includes the pattern "A" and the pattern "B", may be identified, and stored in a database for further usage, such that when a first pattern is monitored by the management server 140, the pattern "C" that includes, for example, the two sub-patterns "A" and "B", may be recognized.

It should be noted that the machine monitoring system 130 is shown in FIG. 1 as a separate component from the management server 140 merely for simplicity purposes and without limitation on the disclosed embodiments. The machine monitoring system 130 may be incorporated in the management server 140 so as to allow the management server 140 to obtain and preprocess sensory input data without departing from the scope of the disclosure.

It should also be noted that the embodiments described hereinabove with respect to FIG. 1 are discussed with respect to a client device 160 and a machine 170 merely for simplicity purposes and without limitation on the disclosed embodiments. Multiple client devices may receive information related to machine maintenance, trends, and failures without departing from the scope of the disclosure. Additionally, sensory input data related to multiple machines may be collected to determine failures of any or all of the machines without departing from the scope of the disclosure.

It should be further noted that the embodiments disclosed herein are not limited to the specific architecture illustrated in FIG. 1 and other architectures may be equally used without departing from the scope of the disclosed embodiments. Specifically, the management server 140 may reside in a cloud computing platform, a datacenter, on premises, and the like. Moreover, in an embodiment, there may be a plurality of management servers operating as described hereinabove and configured to either have one as a standby proxy to take control in a case of failure, to share the load between them, or to split the functions between them.

Figure 2:
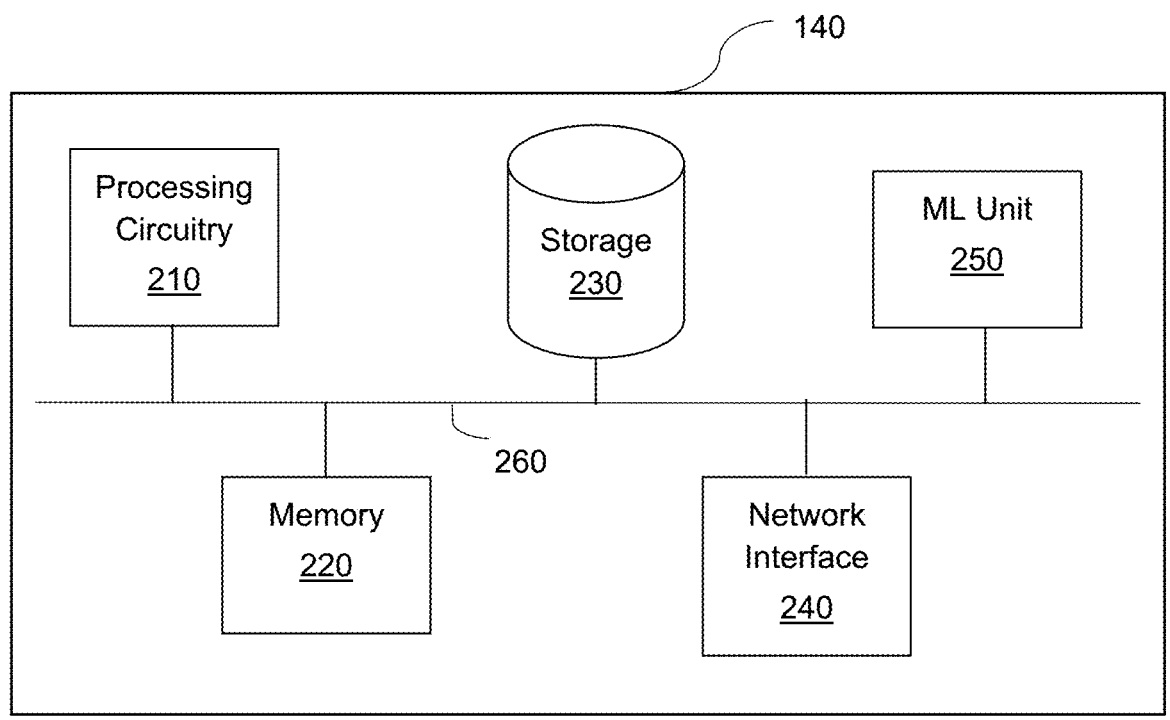
FIG. 2 is a block diagram of a management server according to an embodiment.

FIG. 2 shows an example block diagram of the management server 140 implemented according to one embodiment. The management server 140 includes a processing circuitry 210 coupled to a memory 220, a storage 230, a network interface 240, and a machine learning (ML) unit 250. In an embodiment, the components of the management server 140 may be connected via a bus 260.

The processing circuitry 210 may be realized as one or more hardware logic components and circuits. For example, and without limitation, illustrative types of hardware logic components that can be used include field programmable gate arrays (FPGAs), application-specific integrated circuits (ASICs), application-specific standard products (ASSPs), system-on-a-chip systems (SOCs), general-purpose microprocessors, microcontrollers, digital signal processors (DSPs), and the like, or any other hardware logic components that can perform calculations or other manipulations of information.

The memory 220 may be volatile (e.g., RAM, etc.), non-volatile (e.g., ROM, flash memory, etc.), or a combination thereof. In one configuration, computer readable instructions to implement one or more embodiments disclosed herein may be stored in the storage 230.

In another embodiment, the memory 220 is configured to store software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by the one or more processors, cause the processing circuitry 210 to perform the various processes described herein.

The storage 230 may be magnetic storage, optical storage, and the like, and may be realized, for example, as flash memory or other memory technology, CD-ROM, Digital Versatile Disks (DVDs), or any other medium which can be used to store the desired information.

The network interface 240 allows the management server 140 to communicate with the machine monitoring system 130 for the purpose of, for example, receiving raw and/or preprocessed sensory input data. Additionally, the network interface 240 allows the management server 140 to communicate with the client device 160 in order to send, e.g., notifications related to anomalous activity, machine failure prediction, and the like.

The machine learning unit 250 is configured to perform machine learning based on sensory input data received via the network interface 240 as described further herein. In an embodiment, the machine learning unit 250 is further configured to determine, based on one or more machine learning models, predictions for failures of the machine 170. In a further embodiment, the machine learning unit 250 is also configured to determine at least one corrective solution recommendation for avoiding or mitigating the determined predicted failures. As a non-limiting example, the at least one recommendation may indicate that an exhaust pipe on the machine 170 should be replaced with a new exhaust pipe to avoid failure. In a further embodiment, the machine learning unit 250 is further configured to determine, based on one or more machine learning models, a correlation level between a first suspicious pattern of a first anomalous sensory input behavior and a second pattern of a second anomalous sensory input behavior as further described herein above.

It should be understood that the embodiments described herein are not limited to the specific architecture illustrated in FIG. 2, and other architectures may be equally used without departing from the scope of the disclosed embodiments.

Figure 3A:
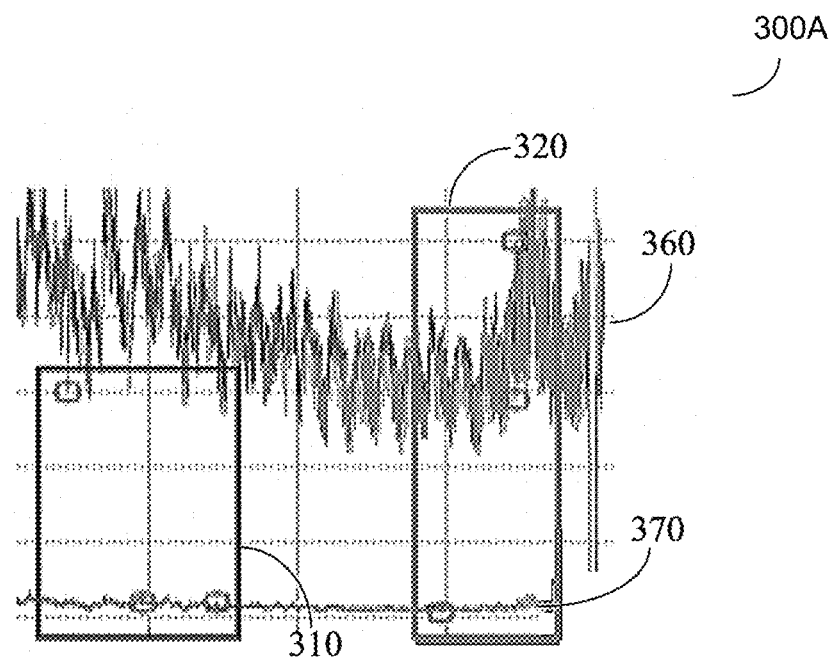
FIG. 3A simulates representation of a first suspicious pattern of a first anomalous sensory input behavior according to an embodiment.

FIG. 3A is an example simulation illustrating representation of a first suspicious pattern of a first anomalous sensory input behavior according to an embodiment. The simulation shown in FIG. 3A includes a graph 300A in which two groups of anomalies are identified. Each group includes one or more anomalies of a plurality of parameters of a machine, e.g., the machine 170 of FIG. 1. The group 310 includes three anomalies that are related to two parameters of the machine, such as the vibration 360, in which a single anomaly is detected, and the temperature 370, in which two anomalies are detected. The group 320 shows two anomalies that are related to the vibration 360 of the machine and a single anomaly related to the machine temperature 370. The first group 310 and the second group 320 may be considered as a first suspicious pattern of a plurality of anomalies.

Figure 3B:
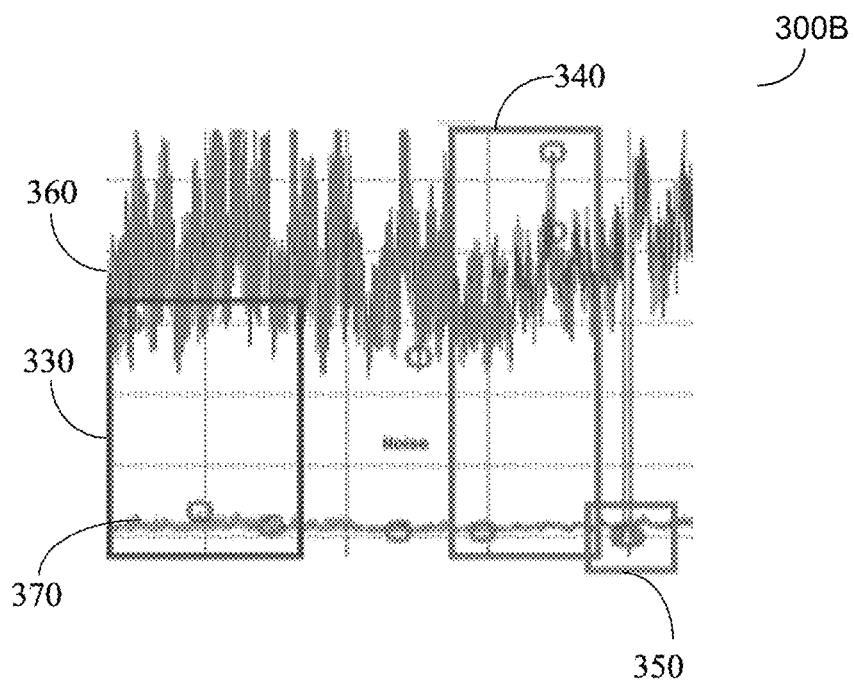
FIG. 3B simulates representation of a second pattern of a second anomalous sensory input behavior according to an embodiment.

FIG. 3B is an example simulation illustrating representation of a second pattern of a second anomalous sensory input behavior according to an embodiment. The simulation shown in FIG. 3B includes a graph 300B in which two groups of anomalies are identified. Each group includes one or more anomalies of a plurality of parameters of a machine, e.g., the machine 170 of FIG. 1. The group 330 includes three anomalies that are related to two parameters of the machine, such as the vibration 360 in which a single anomaly is detected and the temperature 370 in which two anomalies are detected. The group 340 shows two anomalies that are related to the vibration 360 of the machine and a single anomaly related to the machine temperature 370. The group 330 and the group 340 may be considered as a second pattern of a plurality of anomalies to which the first suspicious pattern can be compared. The graph 300B further shows a machine failure 350 that occurs after the second pattern, i.e., the group 330 and the group 340, ends.

In an embodiment, the second pattern described hereinabove allows for the prediction of an upcoming machine failure, in real-time or near real-time, of at least one machine. That is, by comparing a first suspicious pattern to the second pattern, a correlation between the first suspicious pattern and the second pattern is determined. Thus, considering the fact that a machine failure has been recorded after the second pattern has ended, the management server 140 determines that a machine failure will occur after the first suspicious pattern.

Figure 4:
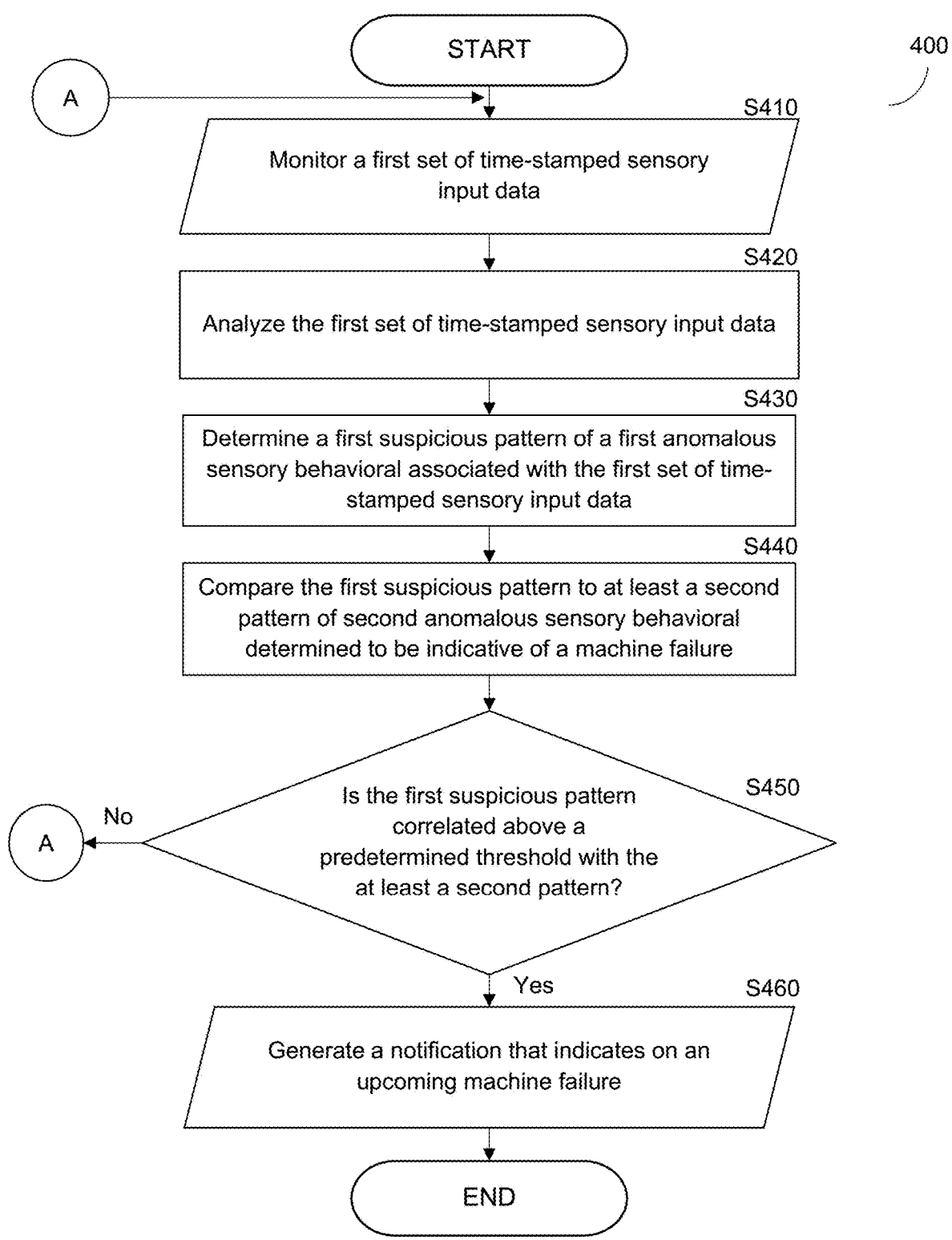
FIG. 4 is an example flowchart illustrating a method for recognizing and forecasting anomalous sensory behavioral patterns of a machine according to an embodiment.

FIG. 4 is an example flowchart 400 illustrating a method for recognizing and forecasting anomalous sensory behavioral patterns of a machine according to an embodiment. In an embodiment, the method is performed by the management server 140 of FIG. 1.

At S410, a first set of time-stamped sensory input data related to at least one machine, e.g., the machine 170 of FIG. 1, are monitored. Each type of the time-stamped sensory input data may be related to at least a process that is associated with the machine.

At S420, the first set of time-stamped sensory input data is analyzed. The analysis may be achieved using one or more machine learning models and is designed to detect anomalies in each type of the sensory input data.

At S430, a first suspicious pattern of a first anomalous sensory input behavior that is associated with the first set of time-stamped sensory input data is determined. The first suspicious pattern of the first anomalous sensory input behavior may include, for example, sensor measurement features, sensor anomalies, anomalous groups, machinery operational states, machine faults, and the like. The first suspicious pattern may include one or more arrays of sensors anomalies, anomalous groups, and the like, that reflect the time at which each anomaly occurred and other related information such as values associated with the anomalies, i.e., abnormal parameter values, features, and the like. The abnormal parameter values may be, for example, the temperature of the machine or a portion thereof, pounds per square inch (PSI), speed, etc. associated with a machine.

At S440, the first suspicious pattern is compared to at least a second sequence of a second anomalous sensory input behavior, which is associated with at least a second set of time-stamped sensory input data, determined to be indicative of a machine failure. The comparison is achieved by applying at least one machine learning algorithm on the at least one first suspicious pattern and the at least a second pattern.

At S450, it is determined whether the first suspicious pattern is correlated above a predetermined threshold with the at least a second pattern and, if so, execution continues at S460; otherwise, execution continues with S410.

At S460, a notification that forecasts an upcoming machine failure of the at least one machine is generated.

The various embodiments disclosed herein can be implemented as hardware, firmware, software, or any combination thereof. Moreover, the software is preferably implemented as an application program tangibly embodied on a program storage unit or computer readable medium consisting of parts, or of certain devices and/or a combination of devices. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such a computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A method for recognizing anomalous sensory behavior patterns of a machine, comprising:

monitoring a first set of time-stamped sensory input data related to at least one machine;

determining, upon analysis of the first set of time-stamped sensory input data, a first suspicious pattern of a first anomalous sensory input behavior associated with the first set of time-stamped sensory input data;

comparing the first suspicious pattern to a second pattern of a second anomalous sensory input behavior that is associated with a second set of time-stamped sensory input data, wherein the second pattern previously determined to be indicative of a machine failure;

determining if the first suspicious pattern is correlated above a predetermined threshold with the second pattern; and generating a notification that forecasts an upcoming machine failure of the at least one machine upon determination that the first suspicious pattern is correlated above a predetermined threshold with the second pattern.

2. The method of claim 1, wherein the notification indicates on at least one of: a determined pattern that is indicative of an upcoming machine failure, a root cause, and at least one corrective solution recommendation.

3. The method of claim 1, wherein the analysis of the first set of time-stamped sensory input data is achieved using at least one of: a machine learning model and a deep learning model.

4. The method of claim 1, wherein the determination of the first suspicious pattern is achieved using a correlation function.

5. The method of claim 1, wherein the comparison further comprises applying at least one machine learning algorithm on the first suspicious pattern and a second pattern.

6. The method of claim 1, wherein determining if the first suspicious pattern is correlated above a predetermined threshold with the second pattern further includes determining the time period in which the first suspicious pattern and the second pattern occurred.

7. The method of claim 1, wherein the first suspicious pattern includes at least one of: one or more arrays of sensor anomalies, anomalous groups that reflect the time at which each anomaly occurred, and abnormal parameter values associated with the anomalies.

8. The method of claim 1, further comprising:
preprocessing the first set of time-stamped sensory input data, wherein the preprocessing includes at least one of: data cleansing, normalization, rescaling, re-trending, reformatting, and noise filtering.

9. A non-transitory computer readable medium having stored thereon instructions for causing a processing circuitry to perform a process, the process comprising:

monitoring a first set of time-stamped sensory input data related to at least one machine;

determining, upon analysis of the first set of time-stamped sensory input data, a first suspicious pattern of a first anomalous sensory input behavior associated with the first set of time-stamped sensory input data;

comparing the first suspicious pattern to a second pattern of a second anomalous sensory input behavior that is associated with a second set of time-stamped sensory input data, wherein the second pattern previously determined to be indicative of a machine failure;

determining if the first suspicious pattern is correlated above a predetermined threshold with the second pattern; and generating a notification that forecasts an upcoming machine failure of the at least one machine upon determination that the first suspicious pattern is correlated above a predetermined threshold with the second pattern.

10. A system for recognizing anomalous sensory behavior patterns of a machine, comprising:
a processing circuitry; and
a memory, the memory containing instructions that, when executed by the processing circuitry, configure the system to:

monitor a first set of time-stamped sensory input data related to at least one machine;

determine, upon analysis of the first set of time-stamped sensory input data, a first suspicious pattern of a first anomalous sensory input behavior associated with the first set of time-stamped sensory input data;

compare the first suspicious pattern to a second pattern of a second anomalous sensory input behavior that is associated with a second set of time-stamped sensory input data, wherein the second pattern previously determined to be indicative of a machine failure;

determine if the first suspicious pattern is correlated above a predetermined threshold with the second pattern; and generate a notification that forecasts an upcoming machine failure of the at least one machine upon determination that the first suspicious pattern is correlated above a predetermined threshold with the second pattern.

11. The system of claim 10, wherein the notification indicates at least one of: a determined pattern that is indicative of an upcoming machine failure, a root cause, and at least one corrective solution recommendation.

12. The system of claim 10, wherein the analysis of the first set of time-stamped sensory input data is achieved using at least one of: a machine learning model and a deep learning model.

13. The system of claim 10, wherein the determination of the first suspicious pattern is achieved using a correlation function.

14. The system of claim 10, wherein the comparison further comprises applying at least one machine learning algorithm on the first suspicious pattern and a second pattern.

15. The system of claim 10, wherein determining if the first suspicious pattern is correlated above a predetermined threshold with the second pattern further includes determining the time period in which the first suspicious pattern and the second pattern occurred.

16. The system of claim 10, wherein the first suspicious pattern includes at least one of: one or more arrays of sensor anomalies, anomalous groups that reflect the time at which each anomaly occurred, and abnormal parameter values associated with the anomalies.

17. The system of claim 10, wherein the system is further configured to: preprocessing the first set of time-stamped sensory input data, wherein the preprocessing includes at least one of: data cleansing, normalization, rescaling, re-trending, reformatting, and noise filtering.

* * * * *